United States Patent
Schuster et al.

(10) Patent No.: US 6,864,683 B2
(45) Date of Patent: Mar. 8, 2005

(54) INSERTION DEVICE FOR GRADIENT COILS OF A MAGNETIC RESONANCE APPARATUS

(75) Inventors: Johann Schuster, Oberasbach (DE); Stefan Stocker, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/611,498

(22) Filed: Jul. 1, 2003

(65) Prior Publication Data

US 2004/0080318 A1 Apr. 29, 2004

(30) Foreign Application Priority Data

Jul. 1, 2002 (DE) ........................................ 102 29 489

(51) Int. Cl.[7] ................................................ G01V 3/00
(52) U.S. Cl. ..................................................... 324/318
(58) Field of Search ................................ 324/307, 309, 324/318; 600/410, 422; 333/219

(56) References Cited

U.S. PATENT DOCUMENTS

| | | | |
|---|---|---|---|
| 4,567,894 A | 2/1986 | Bergman | |
| 4,920,316 A | * 4/1990 | Egloff | ........................ 324/318 |
| 5,185,576 A | 2/1993 | Vavrek et al. | |
| 5,197,474 A | 3/1993 | Englund et al. | |
| 5,311,134 A | 5/1994 | Yamagata et al. | |
| 5,345,177 A | * 9/1994 | Sato et al. | ................... 324/318 |
| 5,372,137 A | 12/1994 | Wong et al. | |
| 5,451,875 A | * 9/1995 | Patrick et al. | ............... 324/318 |
| 5,489,848 A | * 2/1996 | Furukawa | .................... 324/318 |
| 5,585,724 A | * 12/1996 | Morich et al. | .............. 324/318 |
| 5,783,943 A | 7/1998 | Mastandrea, Jr. et al. | |
| 5,793,210 A | * 8/1998 | Pla et al. | ..................... 324/318 |
| 5,952,830 A | * 9/1999 | Petropoulos et al. | ....... 324/318 |
| 6,160,399 A | * 12/2000 | Radziun et al. | ............. 324/318 |
| 6,518,761 B2 | * 2/2003 | Roozen et al. | .............. 324/318 |
| 6,549,010 B2 | * 4/2003 | Roozen et al. | .............. 324/318 |
| 6,552,543 B1 | * 4/2003 | Dietz | .......................... 324/318 |
| 2002/0180441 A1 | * 12/2002 | Schaaf | ....................... 324/318 |

FOREIGN PATENT DOCUMENTS

| | | |
|---|---|---|
| EP | 0 552 542 | 7/1993 |
| EP | 1 262 788 | 1/2003 |
| WO | WO 03/019218 | 3/2003 |

* cited by examiner

*Primary Examiner*—Christopher W. Fulton
*Assistant Examiner*—Dixomara Vargas
(74) *Attorney, Agent, or Firm*—Schiff Hardin LLP

(57) ABSTRACT

A device for inserting local gradient coils (insert gradient coils) into a magnetic resonance apparatus has movable carrier unit and a boom that is extensible in the horizontal direction, the boom being connected to the movable carrier unit and accepting the gradient coil unit and inserting it into the examination space of the magnetic resonance apparatus.

13 Claims, 2 Drawing Sheets

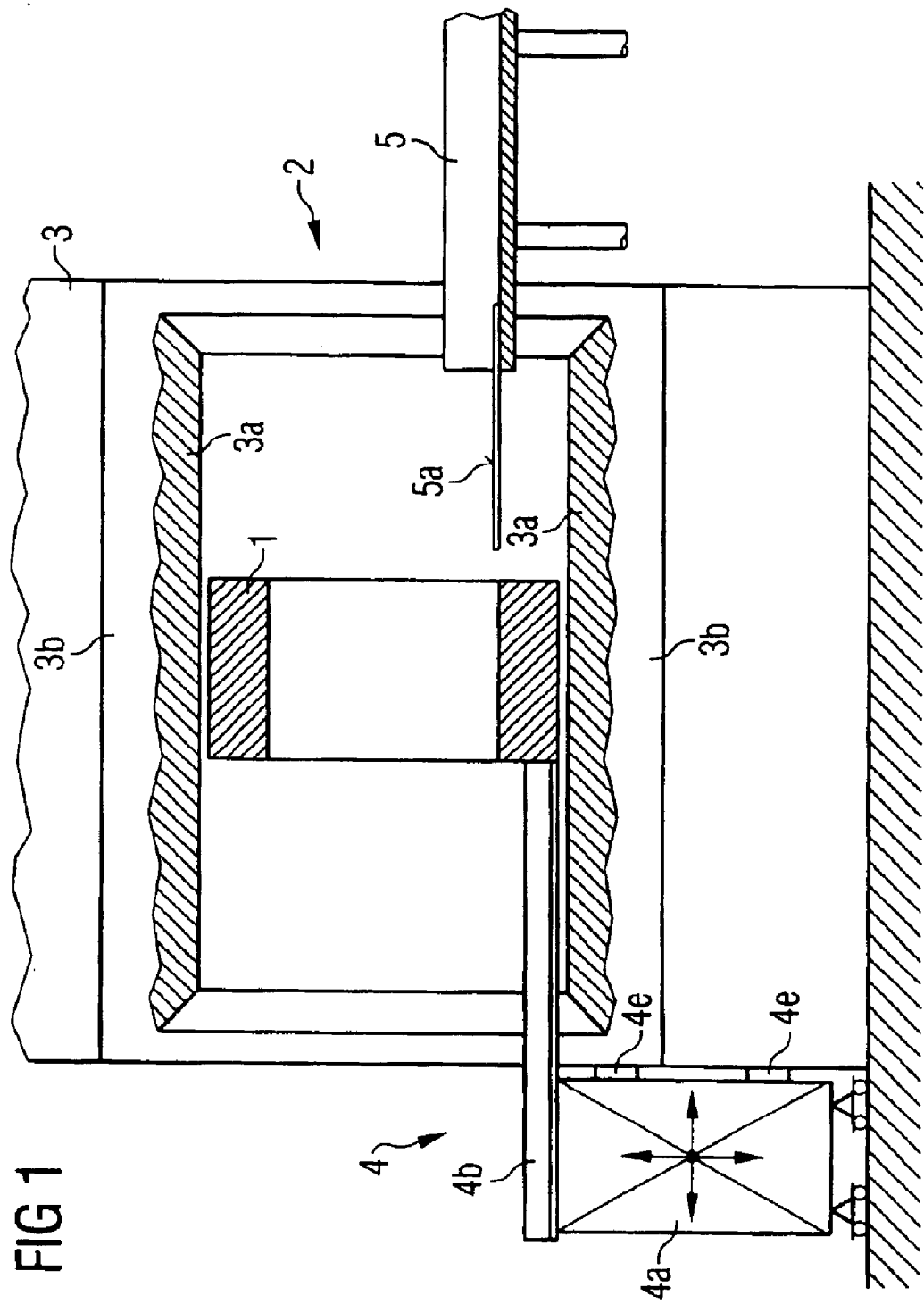

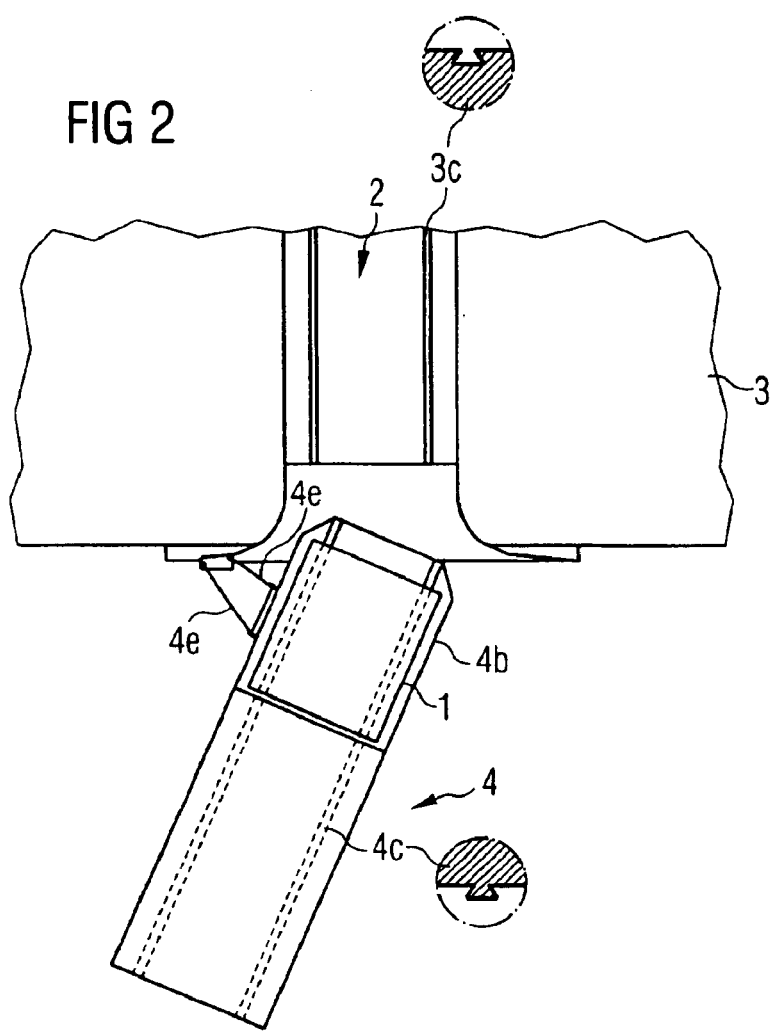
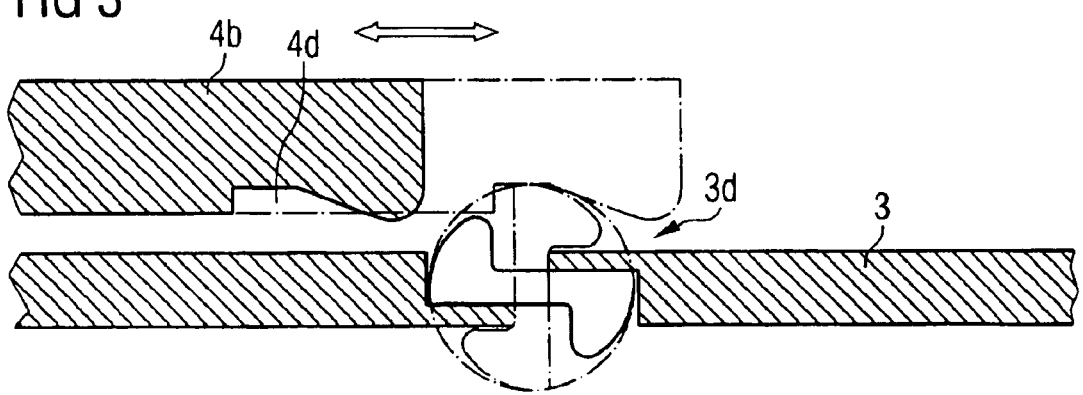

INSERTION DEVICE FOR GRADIENT COILS OF A MAGNETIC RESONANCE APPARATUS

BACKGROUND OF THE INVENTION

1. Field of the Invention

The present invention is directed to a device for the insertion of local gradient colls into a magnetic resonance apparatus.

2. Description of the Prior Art

Magnetic resonance systems have been employed for many years in medicine and in biophysics for acquiring images from the inside of the body of an examination subject. Magnetic resonance tomography is based on the physical phenomenon of nuclear magnetic resonance. In the examination procedure, the examination subject is exposed to a strong, constant magnetic field, causing the previously irregularly oriented nuclear spins of the atoms to align in the examination subject. These unordered nuclear spins are excited to a specific oscillations (resonant frequency) by means of radio-frequency waves. This oscillation generates the actual measured signal (RF response signal) for the actual image acquisition in magnetic resonance tomography that is picked up by suitable reception coils.

A pre-condition for the image acquisition is an exact identification of the respective locations at which the Rf response signals arise in the examination subject (location information, or location encoding). This location information is acquired by means of auxiliary magnetic fields (magnetic gradient fields) that are generated along the three spatial directions by gradient coils. The gradient field superimposed on the basic field is designed such that the field strength, and thus the resonant frequency as well is different in every volume element. When RF energy at a defined resonant frequency is emitted into the subject, only those atoms can be excited that are situated at a location at which the magnetic fields satisfy the corresponding resonance condition. Suitable changes of the gradient fields make it possible to shift the location of such a volume element at which the resonance condition is satisfied in a defined way, and to thus scan the desired region.

For the examination, the subject is introduced into the examination space of the magnetic resonance apparatus and positioned therein. In order to be able to accept examination subjects of different sizes, the examination space must have a minimum size. For medical applications, the size is selected such that a patient can be completely introduced into the examination space.

A local gradient coil unit (insert gradient coil) can be employed for the examination of specific regions of an examination subject, for example the head of a patient, U.S. Pat. No. 5,185,576 discloses such a local gradient coil unit that is introduced into the examination space of the magnetic resonance apparatus.

With their smaller dimensions, local gradient coils have advantages over the built-in whole-body gradient coils of a magnetic resonance apparatus in terms of the obtainable gradient intensity and the power demands made on the gradient amplifier that feeds the gradient coil unit. For operation, the local gradient coil unit together with the integrated, local radio-frequency antenna must be firmly anchored in the examination space of the magnetic resonance apparatus in order to withstand the forces acting on them.

In some embodiments of local gradient coils the securing of the local radio-frequency antenna in the magnetic resonance apparatus and the removal therefrom can require several hours, since the whole-body antenna of the magnetic resonance apparatus must be un-installed and re-installed in some cases.

U.S. Pat. No. 5,311,134 discloses a magnetic resonance apparatus that has a rail-like guide mechanism on which a movable gradient coil unit can be moved. The magnetic resonance apparatus further has a patient bed with which a patient lying thereon can be positioned both in the interior hollow volume of the examination space as well as in the interior hollow volume of the local gradient coil unit.

U.S. Pat. No. 5,372,137 discloses an arrangement for the insertion of a local gradient coil into the examination space of a magnetic resonance apparatus over the patient bed.

A local gradient coil unit seated on the patient bed that is movable relative to a patient borne on the patient bead is disclosed by U.S. Pat. No. 5,197,474.

U.S. Pat. No. 4,567,894 A discloses a patient bed that can be coupled to and uncoupled from a magnetic resonance apparatus by means of a coupling mechanism.

Heretofore, the insertion and mounting of the local gradient coils, which can have a weight of up to 250 kg, has only been manually possible and requires a high outlay of the operating personnel in terms of time and extension.

SUMMARY OF THE INVENTION

An object of the invention is to provide a mechanism that enables a simple and reliable insertion of a local gradient coil unit in different magnetic resonance apparatuses and thus can be easily handled.

This object is achieved according to the invention in a device for inserting a gradient coil unit into the examination space of a magnetic resonance apparatus thus has a movable carrier unit with a boom (cantilevered arm) that can be extended in the horizontal direction, is connected to the movable carrier unit, the boom accepting the gradient coil unit and entering with the gradient coil unit into the examination space of the magnetic resonance apparatus. The inventive device is autonomous, i.e. it operates independently of the patient bed of the magnetic resonance apparatus and can be employed in existing magnetic resonance apparatus. An easily released connection between the extensible boom and the gradient coil unit enables the employment of different gradient coil units for different applications. A variable height positioning of the extensible boom enhances the adaptability to different magnetic resonance apparatuses and—in combination with the movable carrier unit—facilitates removal and storing of the gradient coil unit. The boom that is extensible in horizontal direction can be designed such that it makes available the electrical connections necessary for supplying the gradient coil unit with power. This shortens the fitting times and enhances the security during operation. Additional stability and guidance when introducing the gradient coil unit are achieved in an embodiment having a glide mechanism at the horizontally extensible boom in combination with a corresponding design in the examination space of the magnetic resonance apparatus. A locking arrangement attached to the boom and/or to the gradient coil unit in combination with a corresponding design in the examination space of the magnetic resonance apparatus enables a reliable positioning of the gradient coil unit in the examination space. Little space is required when inserting and removing the introduction mechanism in an embodiment wherein the boom can be extended in telescoping fashion. A docking device attached to the introduction mechanism for docking at the magnetic resonance apparatus provides additional stability during operation and facilitates the insertion of the gradient coil unit into the examination space of the magnetic resonance apparatus.

DESCRIPTION OF THE DRAWINGS

FIG. 1 is a side view, partly in section, of an mbodiment of the inventive insertion device in a magnetic resonance scanner.

FIG. 2 shows the inventive insertion device with a pivotable docking device in a horizontal section through a magnetic resonance scanner.

FIG. 3 is an excerpt showing an example for the locking of the extensible boom of the inventive insertion device in the magnetic resonance apparatus.

DESCRIPTION OF THE PREFERRED EMBODIMENTS

As an example, FIG. 1 shows an arrangement for examining the head of a patient by means of a local gradient coil unit 1. To this end, the head of the patient on a head support 5a is positioned in the local gradient coil unit 1.

For generating a static basic magnetic field, the magnetic resonance apparatus 3 has an essentially hollow-cylindrical superconducting basic field magnet 3b. A gradient coil system 3a for generating gradient fields, which is likewise essentially hollow-cylindrical, is permanently installed in a hollow opening or tunnel of the basic field magnet 3b.

The inventive insertion device 4 is composed of a separate carrier unit 4a, movable, for example, with rollers, and an extensible boom 4b that is attached to the movable carrier unit 4a and carries the gradient coil unit 1. In the state shown in FIG. 1, the gradient coil unit 1 already has been inserted and positioned. During operation, the gradient coil unit 1 is held in the examination space 2 by the boom 4b. A docking device 4e attached to the carrier unit 4a of the insertion device 4 facilitates the insertion of the gradient coil unit 1 into the examination space 2 of the magnetic resonance apparatus 3 and provides additional retention.

The interaction of the individual components of th inventive device is explained below with reference to a sequence for the insertion of the gradient coil unit 1.

First, the gradient coil unit 1 is secured to the boom 4b and is moved from its storage location to the magnetic resonance apparatus 3 with the insertion device 4. However, it is also possible for the gradient coil unit 1 already to be firmly connected to the device 4 by all necessary connections. The insertion device 4 is docked at the magnetic resonance apparatus 3 by means of the docking device 4g and thus is fixed. Subsequently, the height of the boom 4b is set such that the gradient coil unit 1 can be introduced into the examination space 2. The positioning of the gradient coil unit 1 in the examination space 2 ensues either automatically with suitable control software that, for example, controls the entire procedure of insertion and removal after the docking, or—as described below—ensues with adjustable mechanical stops. After operation, the boom 4 is retracted and the gradient coil unit 1 is removed from the examination space 2.

The boom 4b can be designed as to be extensible in telescoping fashion, so the insertion device 4 with the retracted boom requires a smaller set-up area. Further, insertion device 4 does not require space at the service side beyond the space necessary for the maximally extended bed. Remodeling of the room in which the magnetic resonance apparatus 3 is installed or of the shielded compartment thus are not needed.

When the gradient coil unit 1 has its connections firmly connected to the device 4, no further aids and tools are required for inserting the gradient coil unit 1 into the examination space 2. Since the gradient coil unit 1 can be held with the boom 4b during operation, the employment of the inventive insertion device 4 is independent of the cladding configuration of the magnetic resonance apparatus 3.

As portion of a horizontal longitudinal section through the magnetic resonance apparatus 3, FIG. 2 shows a further exemplary embodiment of the inventive insertion device 4. The insertion device 4 is pivotably connected to the magnetic resonance apparatus 3 by the docking device 4e. A glide mechanism 4c (shown with broken lines) is situated at the underside of the extensible boom 4b of the insertion device 4. The shape of the glide mechanism is shown enlarged in the excerpt. A corresponding glide mechanism 3c is present in the examination space 2 of the magnetic resonance apparatus 3 and this also can be used by other components of the magnetic resonance apparatus 3 such as, for example, the patient bed 5.

In this exemplary embodiment, the gradient coil unit 4 is brought laterally to the magnetic resonance apparatus 3 either manually or by means of an electrical drive and is docked against the magnetic resonance apparatus 3 by the docking device 4e. The insertion device 4 is pivotable by means of the docking device 4e such that the glide mechanism 4c at the extended boom 4b of the insertion device 4 is guided into the glide mechanism 3c of the magnetic resonance apparatus 3.

When the extensible boom 4b is inserted, the glide mechanisms 3c and 4c engage into one another and guide the boom 4b. During operation, the boom 4b is fixed by the restricted docking device 4e and the glide mechanisms 3c, 4c.

The pivotably designed docking device 4e is especially advantageous given a changing operation/use of local gradient coil and permanently installed whole-body gradient coil, whereby the patient bed 5 must be partly withdrawn from the opening of the examination space 2 of the magnetic resonance apparatus 3. In this case, the gradient coil unit 2 is moved from the examination space 2 on the boom 4 and pivoted to the side. The bed 5 now can be withdrawn by moving it past the insertion device 4. A renewed insertion of the gradient coil unit 1 is possible without a renewed assembly of the necessary connections of the gradient coil unit 1.

The positioning of the gradient coil unit 1 in the examination space 2 ensues by means of software interacting with the magnetic resonance apparatus 3 or by mechanically adjustable stops.

In an excerpt, FIG. 3 shows an example of the locking of the extensible boom 4b in the magnetic resonance apparatus 3 in a specific inserted position.

The lock mechanism 3d of the magnetic resonance apparatus 3 has two cams, a first cam has a heavier weight than the second cam—for example by being fashioned of a high-density material—so that the position of the lock mechanism 3d shown with solid lines is automatically set when the boom is not inserted or not completely inserted. Given an insertion of the boom 4b from the right into the examination space 2, the lock mechanism 4d of the boom 4b entrains the second cam and places the lock mechanism 3d into a rotary motion around its rotational axis until the first cam reaches the position indicated with broken lines. The inserted boom 4b has thus been locked.

When suitable fastening arrangements for the gradient coil unit 1 are present in the examination space 2, the gradient coil unit 1 can be released from the boom 4b after having been inserted.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance apparatus having a scanner with an interior examination space having an opening at an exterior of said scanner, and a gradient coil unit that is movable into and out of said examination space, and a patient bed that is movable into and out of said examination space, the improvement of a device for inserting said gradient coil unit into said examination space comprising:

a carrier unit separate from said scanner and disposed at said exterior of said scanner and being movable at said exterior to position said carrier unit relative to said opening; and a boom attached to said carrier unit and adapted to receive said gradient coil unit, said boom being extendable in a horizontal direction to insert said gradient coil unit into said examination space, said boom being mechanically independent of said patient bed.

2. A device as claimed in claim 1 wherein said boom has a releasable connection adapted to releasably connect said second end of said boom to said gradient coil unit.

3. A device as claimed in claim 1 wherein said carrier unit varies a position of said boom in a vertical direction.

4. A device as claimed in claim 1 wherein said boom comprises electrical connections adapted to supply power to said gradient coil unit.

5. A device as claimed in claim 1 wherein said boom comprises a glide mechanism adapted to cooperate with said examination space for guiding said boom in said examination space.

6. A device as claimed in claim 1 wherein said boom comprises a glide mechanism adapted to cooperate with said examination space for fixing said boom in said examination space.

7. A device as claimed in claim 1 wherein said boom comprises a glide mechanism adapted to cooperate with said examination space for guiding and fixing said boom in said examination space.

8. A device as claimed in claim 1 further comprising a locking arrangement on said boom adapted to interact with said examination space to lock said boom in a specified inserted position relative to said examination space.

9. A device as claimed in claim 1 further comprising a locking arrangement adapted for connection to said gradient coil unit for interacting with said examination space to lock said gradient coil unit in a specified inserted position relative to said examination space.

10. A device as claimed in claim 1 wherein said boom is a telescoping boom.

11. A device as claimed in claim 1 comprising a docking device adapted to dock said carrier unit to said scanner to position said carrier unit and said boom relative to said examination space for insertion of said gradient coil unit into said examination space.

12. A device as claimed in claim 11 wherein said docking device allows pivoting of said carrier unit relative to said scanner.

13. A device as claimed in claim 12 wherein said boom comprises a glide mechanism for interacting with said examination space to guide said boom relative to said examination space, and wherein said docking device positions said glide mechanism relative to said examination space.

* * * * *